(12) United States Patent
Nogawa et al.

(10) Patent No.: US 10,804,857 B2
(45) Date of Patent: Oct. 13, 2020

(54) AMPLIFIER

(71) Applicants: Nippon Telegraph and Telephone Corporation, Tokyo (JP); NTT Electronics Corporation, Kanagawa (JP)

(72) Inventors: Masafumi Nogawa, Atsugi (JP); Shinsuke Nakano, Atsugi (JP); Hiroaki Sanjoh, Atsugi (JP); Masatoshi Tobayashi, Isehara (JP); Yoshikazu Urabe, Ebina (JP); Masahiro Endo, Atsugi (JP)

(73) Assignees: NIPPON TELEGRAPH AND TELEPHONE CORPORATION, Tokyo (JP); NTT ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/481,367

(22) PCT Filed: May 15, 2018

(86) PCT No.: PCT/JP2018/018662
§ 371 (c)(1),
(2) Date: Jul. 26, 2019

(87) PCT Pub. No.: WO2018/230229
PCT Pub. Date: Dec. 20, 2018

(65) Prior Publication Data
US 2019/0393841 A1 Dec. 26, 2019

(30) Foreign Application Priority Data

Jun. 16, 2017 (JP) ................................. 2017-118863

(51) Int. Cl.
*H03F 1/08* (2006.01)
*H04B 10/69* (2013.01)

(52) U.S. Cl.
CPC ........... *H03F 1/08* (2013.01); *H04B 10/6931* (2013.01); *H03F 2200/171* (2013.01); *H03F 2200/423* (2013.01)

(58) Field of Classification Search
CPC ........................................................ H03F 1/08
See application file for complete search history.

(56) References Cited

U.S. PATENT DOCUMENTS

| 4,560,943 A * | 12/1985 | Negus ..................... H03D 3/06 329/337 |
| 5,309,077 A * | 5/1994 | Choi ....................... G11B 15/48 318/799 |

(Continued)

FOREIGN PATENT DOCUMENTS

| JP | 2007-5875 A | 1/2007 |
| JP | 2010-519857 A | 6/2010 |

(Continued)

OTHER PUBLICATIONS

International Search Report dated Jul. 24, 2018, issued in PCT Application No. PCT/JP2018/018662, filed May 15, 2018.

(Continued)

*Primary Examiner* — Patricia T Nguyen
(74) *Attorney, Agent, or Firm* — Workman Nydegger

(57) ABSTRACT

An amplifier typically exemplified by a TIA is realized that provides an optimal band characteristic, that reduces the possibility of the oscillation, and that achieves a reduced dispersion of the band characteristics. An amplifier for amplifying an electric signal, comprising: a first buffer for amplifying the electric signal; a filter that is connected to an output of the first buffer and that includes a parallel circuit consisting of an inductor and a first capacity; and a second buffer connected to an output of the filter.

18 Claims, 16 Drawing Sheets

(56) References Cited

U.S. PATENT DOCUMENTS

| | | | | |
|---|---|---|---|---|
| 5,361,156 A | * | 11/1994 | Pidgeon | H04B 10/2507 398/193 |
| 5,392,039 A | * | 2/1995 | Thurston | H03M 3/358 341/143 |
| 5,668,552 A | * | 9/1997 | Thurston | H03M 3/444 341/143 |
| 8,340,616 B2 | * | 12/2012 | Shah | H03H 7/0153 333/172 |
| 2008/0204148 A1 | | 8/2008 | Kim et al. | |
| 2012/0231729 A1 | | 9/2012 | Xu et al. | |
| 2014/0333356 A1 | * | 11/2014 | Aryanfar | G06F 1/10 327/158 |
| 2017/0222614 A1 | | 8/2017 | Ella et al. | |

FOREIGN PATENT DOCUMENTS

| | | |
|---|---|---|
| JP | 2010-533990 A | 10/2010 |
| JP | 2010258867 | 11/2010 |
| JP | 2017-46091 A | 3/2017 |
| JP | 2017-512424 A | 5/2017 |
| WO | 2007/099622 A1 | 9/2007 |

OTHER PUBLICATIONS

International Preliminary Report on Patentability dated Dec. 26, 2019, issued in PCT Application No. PCT/JP2018/018662, filed May 15, 2018.

M. Nakamura et al., Burst-Mode Optical Receiver ICs for Broadband Access Networks, IEEE Biopolar/BiCMOS Circuits and Technology meeting, Oct. 2010, pp. 21-28.

Japanese Office Action dated Dec. 24, 2019, issued in Japanese Application No. JP2017-118863.

Office Action dated May 26, 2020 in corresponding Japanese Patent Application No. 2017-118863 (with English Translation).

* cited by examiner

AMPLIFIER

TECHNICAL FIELD

The present invention relates to an amplifier. More specifically, the invention relates to an amplifier that is used for an optical receiver and that includes a transimpedance amplifier to convert a current signal to a voltage signal with amplification.

BACKGROUND ART

An optical receiver used for optical communication is configured so that an optical signal received by a photodetector such as a photo diode (Photo Diode, hereinafter abbreviated as PD) is converted to a current signal. Next, the current signal is converted by an electric amplifier, a typical example of which includes a transimpedance amplifier (Transimpedance Amplifier, hereinafter abbreviated as TIA) to a voltage signal to increase the signal strength.

The optical receiver has the minimum reception sensitivity as one of the most important parameters for which the ability to receive an optical signal having the lowest possible strength is desired. Electric amplifiers for optical receivers, a typical example of which is TIA, are desired to have a low-noise characteristic. In addition, an appropriate photoelectric conversion of an optical signal requires a sufficient broadband characteristic depending on a signal bit rate. However, there is a trade-off relation between the noise characteristic and the broadband characteristic. Specifically, when a TIA band is set to be excessively wider than a reception signal, an increased noise band is caused to increase the noise amount appearing in the TIA output to cause the optical receiver to have a decreased reception sensitivity. An excessively-narrow TIA band on the other hand provides a reduced noise amount but requires a longer time for the TIA output signal to rise or fall, which causes an intersymbol interference, making it difficult to determine the signal logical level and to cause the optical receiver to have a declined reception sensitivity.

Thus, an amplifier for an optical receiver such as TIA is designed to provide an optimal reception sensitivity of the optical receiver by setting a band that prevents the intersymbol interference from occurring for example. A frequency range allowing the passband gain to decline by 3 dB is called a −3 dB band. The −3 dB band is frequently designed, in the case of a low-pass characteristic, to provide a cutoff frequency approximately 0.6 to 0.8 times smaller than the signal speed. For example, Non-Patent Publication 1 discloses a design example of a TIA having a −3 dB band of 6.7 GHz (cutoff frequency) with regard to a signal speed of 10.3 Gb/s.

FIG. 1 illustrates a circuit block of a conventional TIA and illustrates a circuit block of the TIA disclosed in Non-Patent Publication 1 in a simplified manner. A TIA 10 includes a transimpedance stage 11, an intermediate buffer 12, and an output buffer 13 connected in this order. When a PD receives an optical signal, the PD outputs a current signal Iin. The current signal Iin is converted by a transimpedance stage 11 to a voltage signal. The voltage signal is amplified by the intermediate buffer 12. Next, the amplified voltage signal is transmitted by the output buffer 13 to a limiting amplifier (Limiting Amplifier, hereinafter abbreviated as LA) connected to the next stage. The LA is not shown in FIG. 1 and only an input terminating resistance Rt of the LA is shown. The output buffer also may have an amplification function. The capacity Cac between the output buffer and the terminating resistance Rt is an AC coupling capacity and is used to connect the TIA and the LA.

In the case of the conventional TIA, a gain, which depends on the position of a pole of each stage, is caused to attenuate approximately at a ratio of −60 dB/decade when being subjected to a frequency higher than a −3 dB band.

As described above, when an amplifier such as a TIA has an excessively-wide band, the output from the TIA includes therein increased noise, causing a declined reception sensitivity. Thus, an improved reception sensitivity is desired by causing, while securing a −3 dB band set to 0.6 to 0.8 times smaller than the signal speed, the gain to sharply attenuate at a frequency higher than the −3 dB band.

However, the conventional TIA, which depends on the position of a pole of each stage, can provide the attenuation of only about −60 dB/decade, showing a limitation on the noise reduction. For example, an increase of the number of the circuit stages can provide an increased attenuation factor. However, this increase tends to cause the decline of the −3 dB band, which disadvantageously causes a deteriorated signal waveform and an increased power consumption.

Furthermore, when the TIA is mounted on a low-cost package or a substrate for example in order to reduce the cost of the optical receiver, a risk is caused where a parasitic element of the TIA for the package causes an unintended resonance phenomenon to occur at a high frequency to cause the oscillation of the receiver. To prevent this, a frequency higher than the −3 dB band is desirably handled by causing a sharp attenuation of the gain to suppress the amplification of the resonance phenomenon to thereby suppress the oscillation of the receiver.

In the case of the conventional TIA, the −3 dB band is determined mainly by an active device such as a transistor. Thus, another disadvantage is that a variation of the semiconductor manufacturing processes, a temperature variation, and a power supply variation tend to cause dispersed band characteristics, easily causing a lower yield.

CITATION LIST

Non-Patent Literature

Non-Patent Publication 1—M. Nakamura, et al., "Burst-mode Optical Receiver ICs for Broadband Access Networks," IEEE Bipolar/BiCMOS Circuits and Technology Meeting, October 2010, pp. 21-28.

SUMMARY OF INVENTION

It is an objective of the present invention to realize an amplifier typically exemplified by TIA for which the band characteristic is optimized, the possibility of the oscillation is reduced, and the dispersion of band characteristics is reduced.

In order to achieve the objective as described above, one embodiment of the present invention provides an amplifier for amplifying an electric signal, including: a first buffer for amplifying the electric signal; a filter connected to an output of the first buffer and including a parallel circuit consisting of an inductor and a first capacity; and a second buffer connected to an output of the filter.

The filter is configured so that the parallel circuit has a resonance frequency 1 to 2 times higher than the highest speed of the signal speed of the electric signal.

DESCRIPTION OF EMBODIMENTS

The following section will describe an embodiment of the present invention in detail with reference to the drawings.

Figure 2:
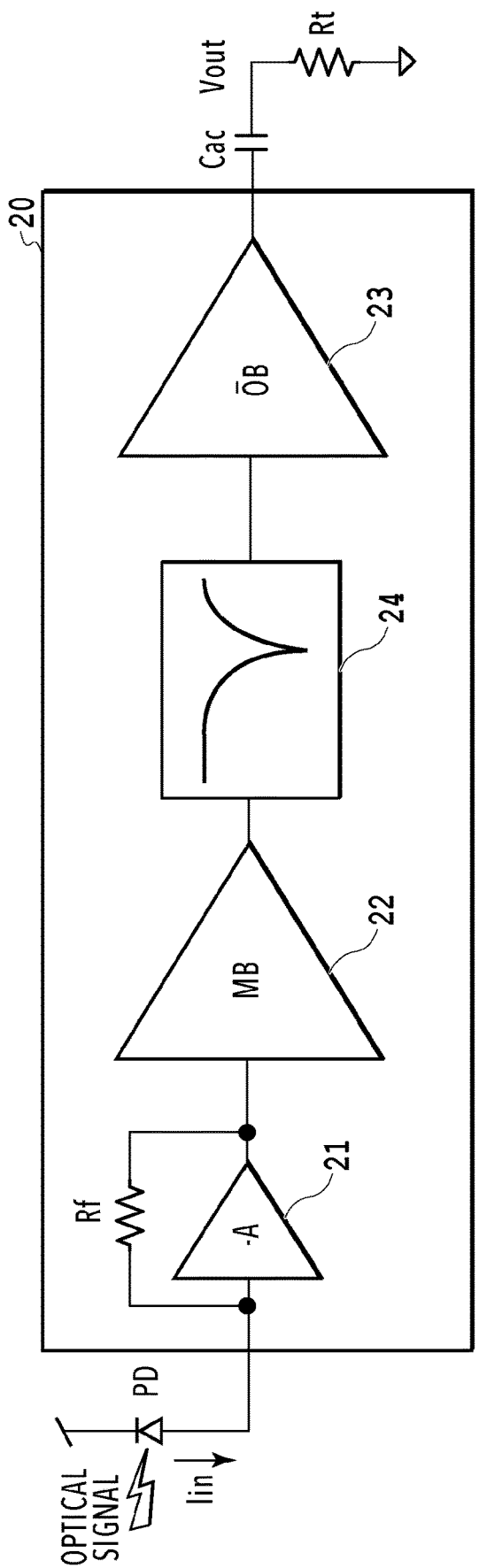
FIG. 2 illustrates a circuit block of the TIA according to one embodiment of the present invention.

FIG. 2 illustrates a circuit block of the TIA according to one embodiment of the present invention. The TIA 20 includes a transimpedance stage 21 for converting a current signal to a voltage signal, the intermediate buffer 22, the filter 24, and the output buffer 23 connected in this order. The TIA 20 is used for an optical communication receiver and is configured so that an anode of the PD for receiving an optical signal is connected to the input of the transimpedance stage 21 also functioning as an input of the TIA 20. The output buffer 23, which is an output of the TIA 20, has an output connected to an LA (not shown) by AC coupling. A capacity Cac represents an AC coupling capacity and a resistance Rt represents the input terminating resistance of the LA.

The filter 24 is a parallel circuit consisting of an inductor and a capacity and causes the signal strength to attenuate by the resonance phenomenon. The parallel circuit has a resonance frequency 1 to 2 times larger than the signal speed (or the highest speed of a plurality of speeds of signals) (e.g., the resonance frequency is within a range from 10 GHz to 20 GHz when the signal speed is 10 Gb/s).

Figure 3A:
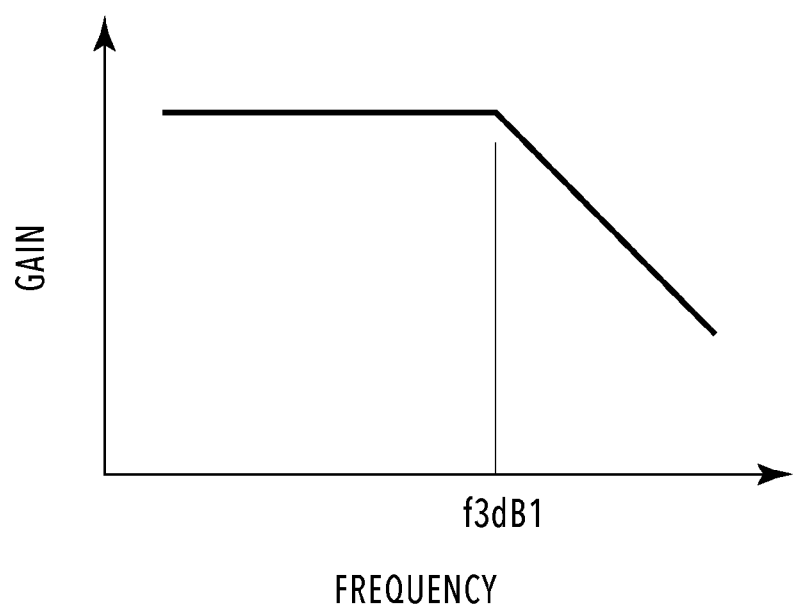
FIG. 3A illustrates the gain characteristic of an output of an intermediate buffer 22 among the frequency characteristics of the interior of the TIA according to this embodiment.
Figure 3B:
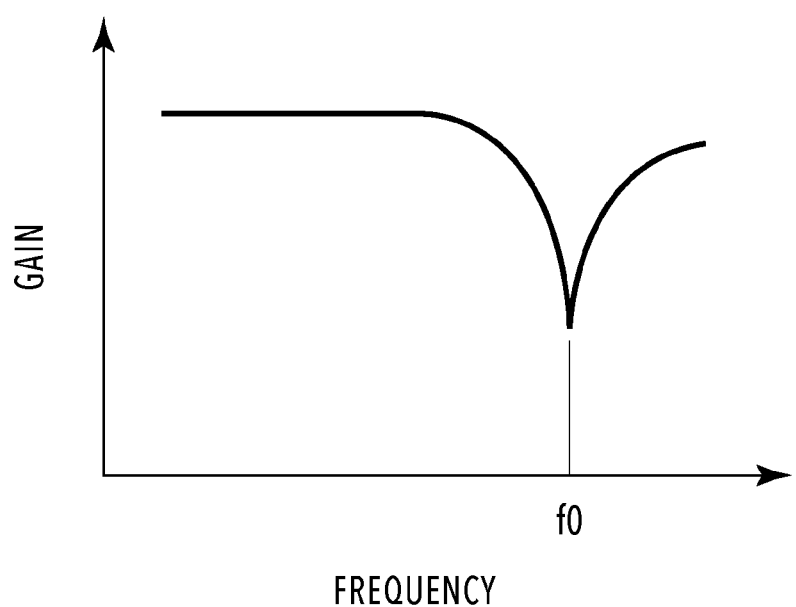
FIG. 3B illustrates the pass characteristic of a filter 24 among the frequency characteristics of the interior of the TIA according to this embodiment.
Figure 3C:
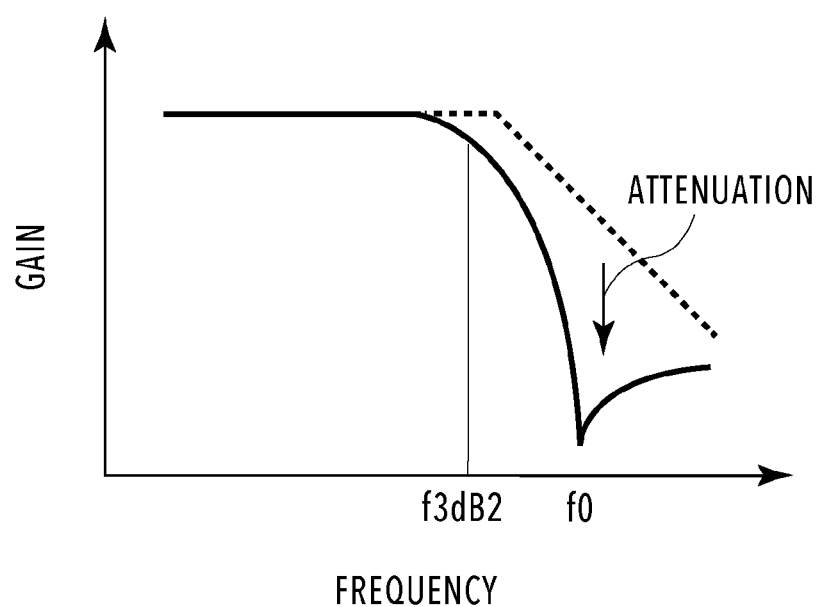
FIG. 3C illustrates the gain characteristic of the input of an output buffer 23 among the frequency characteristics of the interior of the TIA according to this embodiment.

FIGS. 3A-3C illustrate the frequency characteristics of the interior of the TIA according to this embodiment. FIG. 3A illustrates the gain characteristic of the output of the intermediate buffer 22. FIG. 3B illustrates the pass characteristic of the filter 24. FIG. 3C illustrates the gain characteristic of the input of the output buffer 23. The reference numeral f0 in the drawing shows the resonance frequency of the filter 24. As shown in FIG. 3B, a signal passing through the filter is blocked at f0. As shown in FIG. 3A, the output from the intermediate buffer 22 has a gain caused to attenuate at a constant rate at a frequency higher than f3 dB1 (f3 dB1 is the −3 dB band of the output of the intermediate buffer 22). When the signal has passed the filter 24, the action by the filter 24 can cause, as shown in FIG. 3C, the gain to sharply attenuate at a frequency exceeding f3 dB2 (f3 dB2 is the −3 dB band of the input of the output buffer 23). FIG. 3C illustrates the gain characteristic of the output of the intermediate buffer 22 shown in FIG. 3A, which is shown by the dotted line for comparison. It is established that f3 dB2≤f3 dB1.

As shown in FIGS. 3A-3C, in this embodiment, the gain of the amplifier can be allowed to sharply attenuate at a frequency exceeding the −3 dB band. This can consequently suppress the high frequency-side noise, thus realizing a receiver having a higher sensitivity.

The following section will summarize the relation between a signal and noise. In optical communication, when the signal speed is lower than about 10 Gb/s, an NRZ (Non Return to Zero) signal is generally used. The NRZ signal has a signal power whose 80% or more is included in frequencies in a range from a low frequency to a frequency about 0.5 times smaller than the signal speed (or frequencies up to 5 GHz in the case of 10 Gb/s) and has a signal power whose 90% or more is included in frequencies 0.75 times smaller than the signal speed (or frequencies up to 7.5 GHz in the case of 10 Gb/s). Thus, as described above, the −3 dB band set to 0.6 to 0.8 times smaller than the signal speed can secure the power required to transmit information.

On the other hand, noise (shot noise and thermal noise in particular) is white noise and has a spectrum including a high frequency exceeding those including signals. Thus, if the −3 dB band is excessively wide, most signals are not included and the gain exists in a frequency band including noise only. Thus, only noise is amplified to cause a declined signal to noise ratio (SN ratio), which causes a deteriorated receiver sensitivity. Thus, the sharp reduction of the gain at a frequency higher than the −3 dB band (i.e., a frequency band not required for the signal transmission) is effective in providing a receiver having a higher sensitivity.

The following section will examine the range of f0. As described above, f0 is set to frequencies 1 to 2 times higher than the signal speed. If f0 is lower than a frequency 1 time lower than the signal speed, then it is difficult for the −3 dB band of the amplifier to be maintained at a level 0.6 to 0.8 lower than the signal speed. If f0 is 2 times higher than the signal speed on the other hand, the gain in this range is small without requiring the use of a filter. Thus, the filter provides a small noise reduction effect. Thus, f0 is preferably set to a level 1 to 2 times higher than the signal speed.

The suppression of the gain in the high frequency provides a further effect as described below. Specifically, when an amplifier is mounted on a package or a substrate, an intended resonance phenomenon may occur due to parasitic elements included in the package, the substrate, or a semiconductor chip for example. Even such a resonance phenomenon can be prevented from being amplified, thus suppressing the oscillation at a high frequency. This can provide the use of a low-cost package for example, thus providing a receiver having a lower cost.

In this embodiment, a filter has a front stage and a rear stage connected to intermediate buffers and output buffers, respectively. Thus, the filter is isolated from an input terminal and an output terminal of the amplifier. This prevents the filter from having an influence on the input impedance and the output impedance of the amplifier, thus preventing a deteriorated characteristic due to signal reflection for example.

Illustrative Embodiment 1

Figure 4:
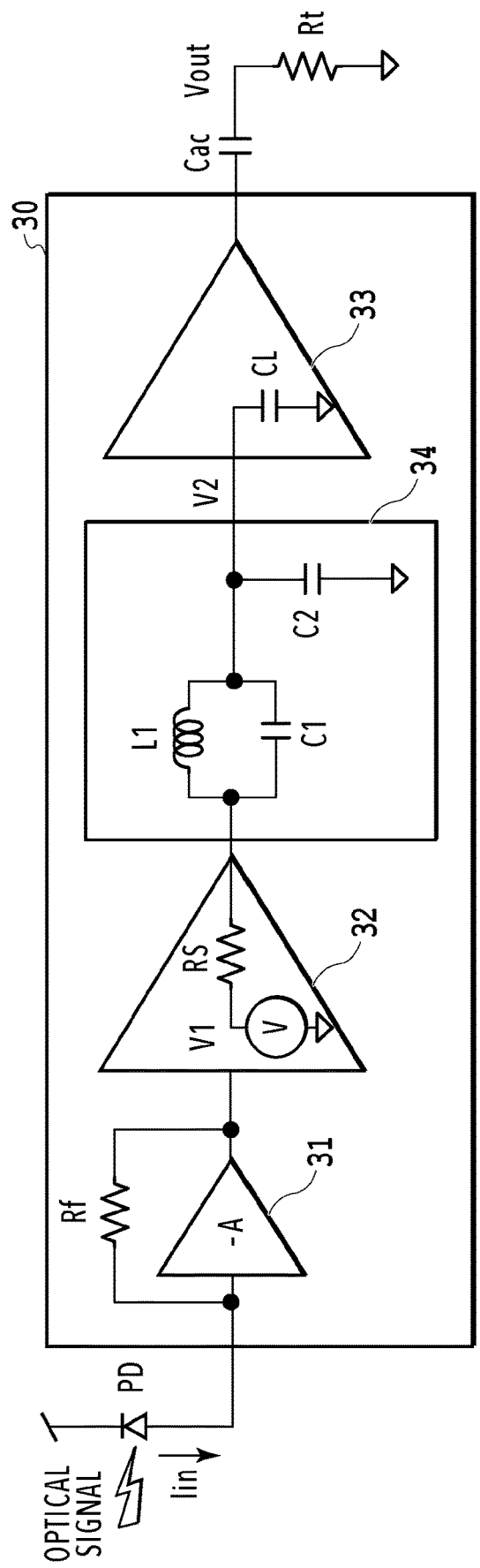
FIG. 4 is a circuit block illustrating the TIA according to Illustrative Embodiment 1 of the present invention.

FIG. 4 illustrates a circuit block of the TIA according to Illustrative Embodiment 1 of the present invention. A TIA 30 includes a transimpedance stage 31, an intermediate buffer 32, a filter 34, and an output buffer 33 connected in this order. In Illustrative Embodiment 1, the filter 24 of the embodiment shown in FIG. 2 is substituted with the filter 34 including a parallel resonator consisting of an inductor L1 and a capacity C1, and a capacity C2. One end of the parallel resonator functions as an input of the filter 34 while the other end functions as an output of the filter 34. One end of the capacity C2 is connected to the output of the filter 34 and the other end is connected to a reference electric potential (e.g., ground electric potential). It is assumed that the intermediate buffer 32 has an output resistance RS and a voltage source has a voltage V1. The filter 34 has an output voltage V2 and the output buffer 33 has an input capacity CL.

Figure 1:
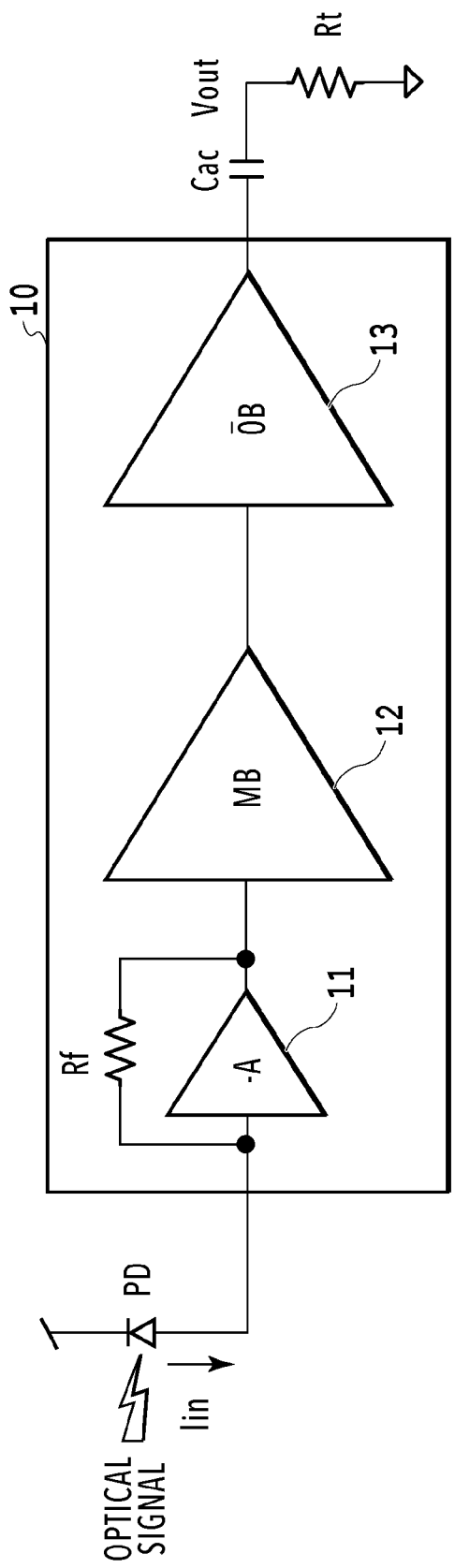
FIG. 1 illustrates a circuit block of a conventional TIA.
Figure 5:
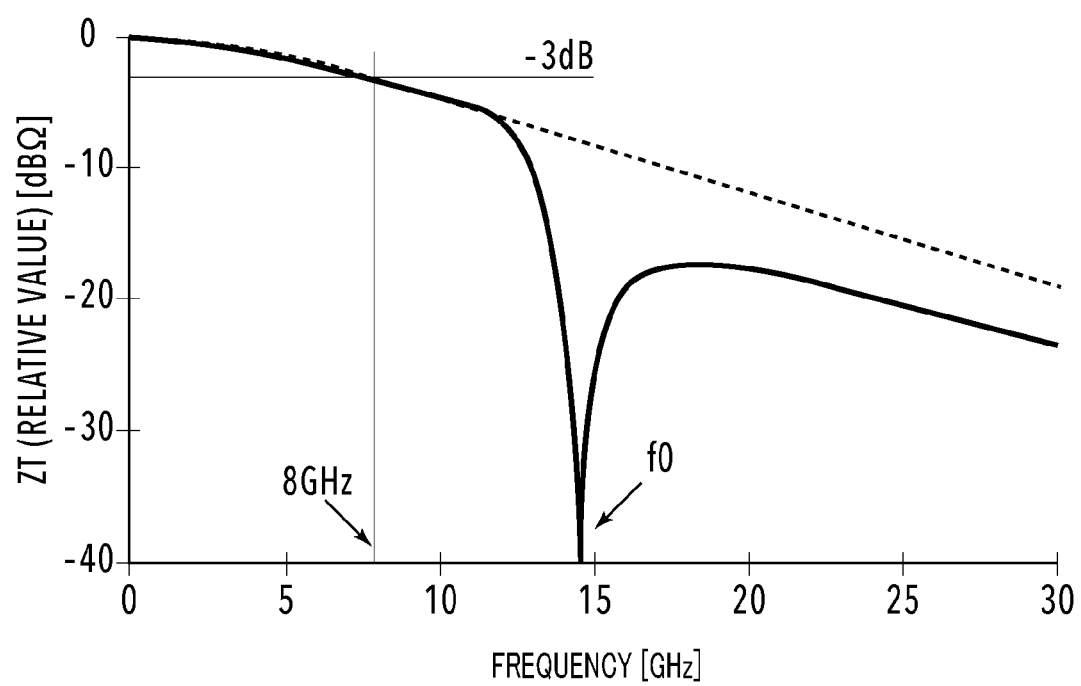
FIG. 5 illustrates a frequency characteristic of the gain of the TIA according to Illustrative Embodiment 1.

FIG. 5 illustrates the frequency characteristic of the gain of the TIA according to Illustrative Embodiment 1 based on the calculation result of the frequency characteristic of the transimpedance conversion gain Zt(=Vout/Iin) of the TIA 30. The solid line shows the conversion gain of the TIA 30 of Illustrative Embodiment 1 shown in FIG. 4. The dotted line shows a conversion gain of the conventional TIA 10 of FIG. 1. The vertical axis shows relative values. It is assumed that the signal speed is 10 Gb/s and L1=400 pH and C1=300 fF are set so that the resonance frequency f0 of the parallel resonance circuit of L1 and C1 of the filter 34 is about 1.5 times higher than the signal speed. In this case, the resonance frequency can be calculated as follows:

Formula 1

$$f0 = \frac{1}{2\pi\sqrt{L1C1}} = 14.5 \text{ GHz}$$

At this f0, the resonance circuit has an increased impedance (or ideally becomes infinite) to thereby suppress signals from passing. Thus, Zt can be allowed to sharply attenuate at a frequency generally higher than 10 GHz.

The capacity C2 of the filter 34 has a function to prevent peaks not necessary for Zt from occurring at a frequency lower than f0. A desired peak size is about 3 dB or less and about 6 dB or less at most. The capacity C2 has a value that can be set based on the concept as shown below. First, the electric potential relation for V1 and V2 in FIG. 4 is represented by the following formula (1).

Formula 2

$$\frac{V_2}{V_1} = \frac{1}{1 - \frac{\omega^2 L_1 (C_2 + C_L)}{1 - \omega^2 L_1 C_1} + j\omega(C_2 + C_L)R_S} \quad (1)$$

In the formula, ω represents an angular frequency. When there is no filter (or when the conventional TIA is used), the relation between V1 and V2 is represented by the following formula (2).

Formula 3

$$\frac{V_2}{V_1} = \frac{1}{1 + j\omega C_L R_S} \quad (2)$$

The capacity C2 has a lower limit value that may be determined so that the formula (1) is prevented, when being compared with the formula (2), from having a peak of about 3 to 6 dB or more. The capacity C2 has an upper limit value that may be determined so that the −3 dB band is 0.6 to 0.8 times smaller than the signal speed. The value of the capacity C2 is determined in this manner. Finally, the values of L1, C1, and C2 may be determined in consideration of the entire TIA 30 including front and rear circuit blocks and actual use conditions including the mounting of the TIA 30.

The frequency characteristic of FIG. 5 is an example set so that the −3 dB band of 8 GHz 0.8 times lower than the signal speed (10 Gb/s in this case) while preventing a peak from occurring in the gain Zt. The capacity C2 has another action according to which the gain at a frequency exceeding the resonance frequency f0 also can be reduced than in the case of the conventional example.

As described above, the sharp attenuation of the high frequency-side gain can suppress the high frequency-side noise, thus realizing a receiver having a higher sensitivity. It is clear that Illustrative Embodiment 1 also has an action to suppress the high frequency gain to thereby suppress the unintended resonance amplification of a package for example.

Figure 6:
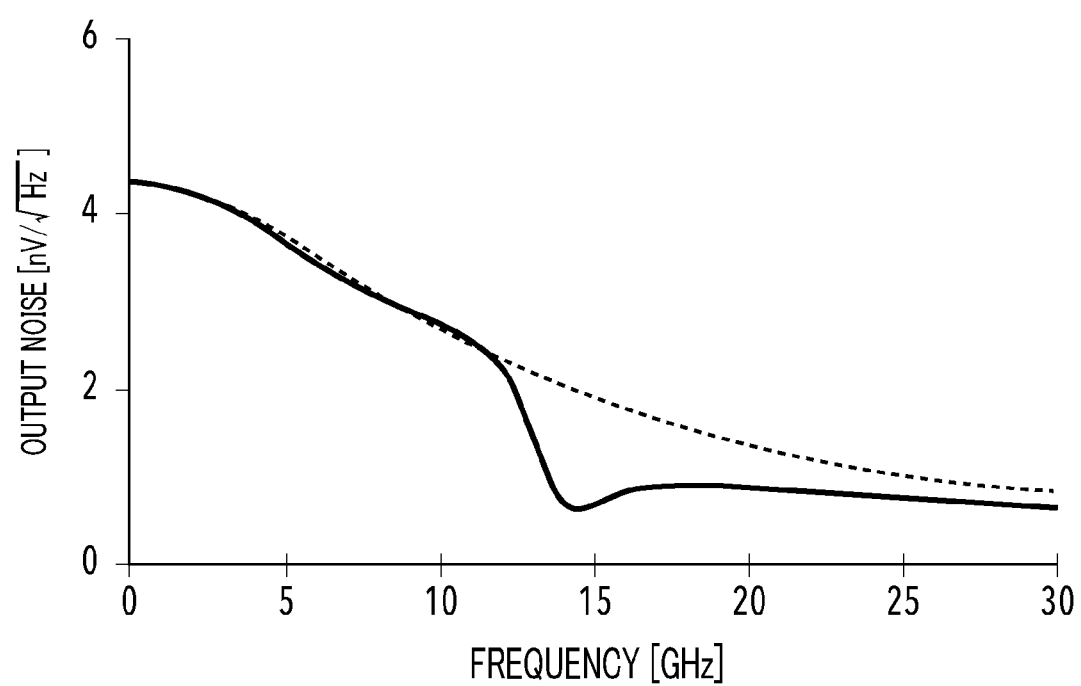
FIG. 6 illustrates the frequency characteristic of the output noise of the TIA according to Illustrative Embodiment 1.

FIG. 6 illustrates a frequency characteristic of the output noise of the TIA according to Illustrative Embodiment 1 based on the calculation result of the frequency characteristic of noise appearing in the output terminal of the TIA 30. The solid line shows the output noise of the TIA 30 of Illustrative Embodiment 1 shown in FIG. 4. The dotted line shows the output noise of the conventional TIA 10 of FIG. 1. For simplicity, only noise due to resistance was considered. However, no change was found in this tendency when an active element such as a transistor was included. This calculation result also shows that the output noise of the amplifier is reduced by Illustrative Embodiment 1.

The only difference between Illustrative Embodiment 1 and the conventional TIA is the addition of the inductor and the capacity. This addition provides an action to suppress the dispersion of the band characteristics. A characteristic to provide the sharp decline of the gain is determined by the inductor and the capacity, which are a passive element. The inductor has a value substantially determined by the shape of the inductor. Thus, the dispersion is small and the capacity value dispersion is at most about 10%. Thus, the dispersion of the band characteristics can be reduced. When the band characteristic is determined by an active element such as a transistor, the dispersion ranges from about 50% to about 100%. However, a more stable band characteristic is provided by Illustrative Embodiment 1. The only required added elements are the inductor and the capacity. The inductor and the capacity themselves do not function as a noise source. Thus, no increase of noise is caused by the additional elements. In addition, the above-described effect can be obtained without requiring an increase of the power consumption.

By the way, the same effect can be obtained by substituting the filter 34 of the LC parallel resonance circuit with an LC serial resonance circuit provided between the output of the intermediate buffer and the reference electric potential (e.g., ground electric potential). However, the filter 34 is advantageous due to the following reason. First, in the case of the LC serial resonance circuit, at a frequency lower than the resonance frequency, the capacity C constituting the serial resonance circuit undesirably appears as a load capacity of the intermediate buffer. Thus, the −3 dB band of the amplifier tends to decline. Second, the LC parallel resonance circuit has a value Q calculated as follows.

Formula 4

$$Q_{parallel} = \frac{1}{G}\sqrt{\frac{C}{L}}$$

In the formula, G shows a parallel parasitic conductance. The value Q of the LC serial resonance circuit is represented as follows.

Formula 5

$$Q_{series} = \frac{1}{R}\sqrt{\frac{L}{C}}$$

In the formula, R represents a serial parasitic resistance. In order to achieve the sharp decline of the gain, the parallel resonance circuit desirably has a high capacity C and a low inductor L. The serial resonance circuit on the other hand desirably has a low capacity C and a high inductor L. However, a high value L to increase the value Q of the serial resonance circuit requires the inductor having a larger physical size. This is disadvantageous because the resultant circuit requires a larger area in order to achieve the serial resonance circuit on a semiconductor integrated circuit. On the other hand, the capacity requires a smaller area than the inductor. Due to these reasons, the LC parallel resonance circuit is advantageous than the LC serial resonance circuit.

Figure 7:
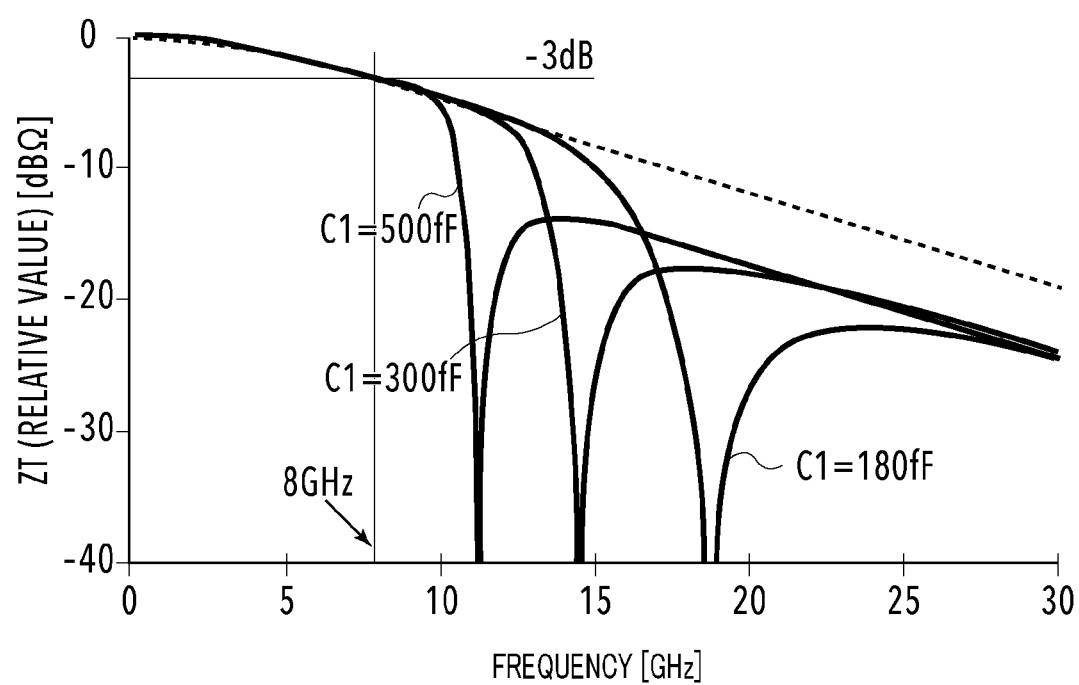
FIG. 7 illustrates the frequency characteristic of the gain when the value of the capacity C1 of the TIA according to Illustrative Embodiment 1 is changed.

FIG. 7 illustrates a gain frequency characteristic when the value of the capacity C1 of the TIA according to Illustrative Embodiment 1 is changed. The solid line shows the conversion gain of the TIA 30 of Illustrative Embodiment 1 shown in FIG. 4 based on the assumption that the filter 34 has L1=400 pH and the capacity C1 is changed. Here, the characteristic is shown when C1=180 fF, 300 fF, and 500 fF is established and the resonance frequency is 18.8 GHz, 14.5 GHz, and 11.3 GHz, respectively. The characteristic when C1=300 fF is established is also shown in the conversion gain shown in FIG. 5. In order to provide an uniform −3 dB band, the value of C2 of the filter 34 was adjusted. The dotted line shows the conversion gain of the conventional TIA 10 of FIG. 1.

As shown in FIG. 7, the LC parallel resonance circuit has the resonance frequency f0 set to be 1 to 2 times higher than the signal speed of 10 Gb/s. This consequently allows, while maintaining the frequency of the −3 dB band, the gain at a frequency exceeding this frequency range to sharply attenuate, thus realizing an amplifier having low noise and a high sensitivity. When the resonance frequency is smaller than the frequency 1 time lower than the signal speed, it is difficult to maintain the −3 dB band. When the resonance frequency is larger than the frequency 2 times higher than the signal speed, the gain reduction is suppressed at a frequency exceeding the −3 dB band. Thus, the resonance frequency is preferably set at a frequency 1 to 2 times higher than the signal speed, as has been described above.

Illustrative Embodiment 2

Figure 8:
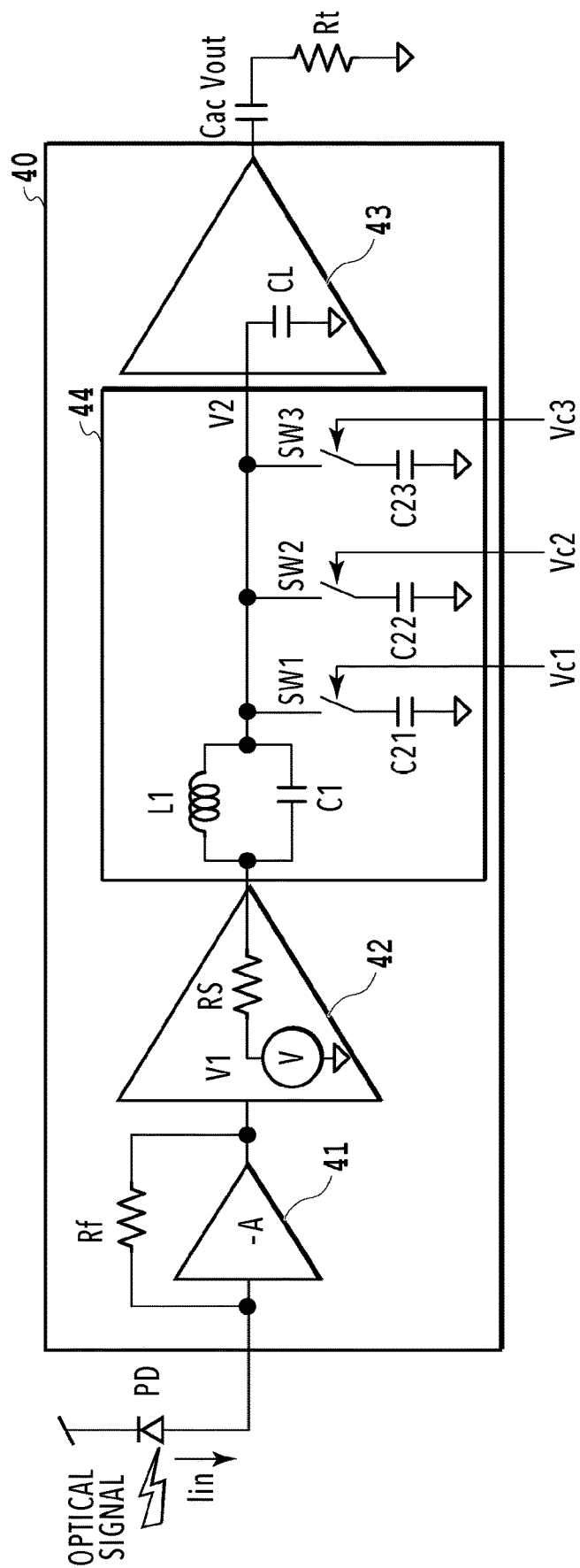
FIG. 8 illustrates a circuit block of the TIA according to Illustrative Embodiment 2 of the present invention.

FIG. 8 illustrates a circuit block of the TIA according to Illustrative Embodiment 2 of the present invention. A TIA 40 includes a transimpedance stage 41, an intermediate buffer 42, a filter 44, and an output buffer 43 connected in this order. In Illustrative Embodiment 2, the capacity C2 of the filter 34 of Illustrative Embodiment 1 shown in FIG. 4 is substituted with a plurality of parallelly-connected capacities that are switched by a switch. Here, three capacities C21, C22, and C23 are provided. These three capacities and the output of the filter 44 (the input of the output buffer 43) have therebetween switches SW1, SW2, and SW3. The switches SW1, SW2, and SW3 are switched to ON or OFF by control signals Vc1, Vc2, and Vc3, respectively. By turning these switches ON or OFF, the connection and the disconnection of the capacities can be switched. These switches can be configured, for example, by an NMOS transistor or a PMOS transistor. This configuration can be used to achieve the TIA having an optimal −3 dB band to various signal speeds. Specifically, a high signal speed can be handled by reducing the total of the values of the connected capacities while a low signal speed can be handled by increasing the total of the values of the connected capacities.

Figure 9:
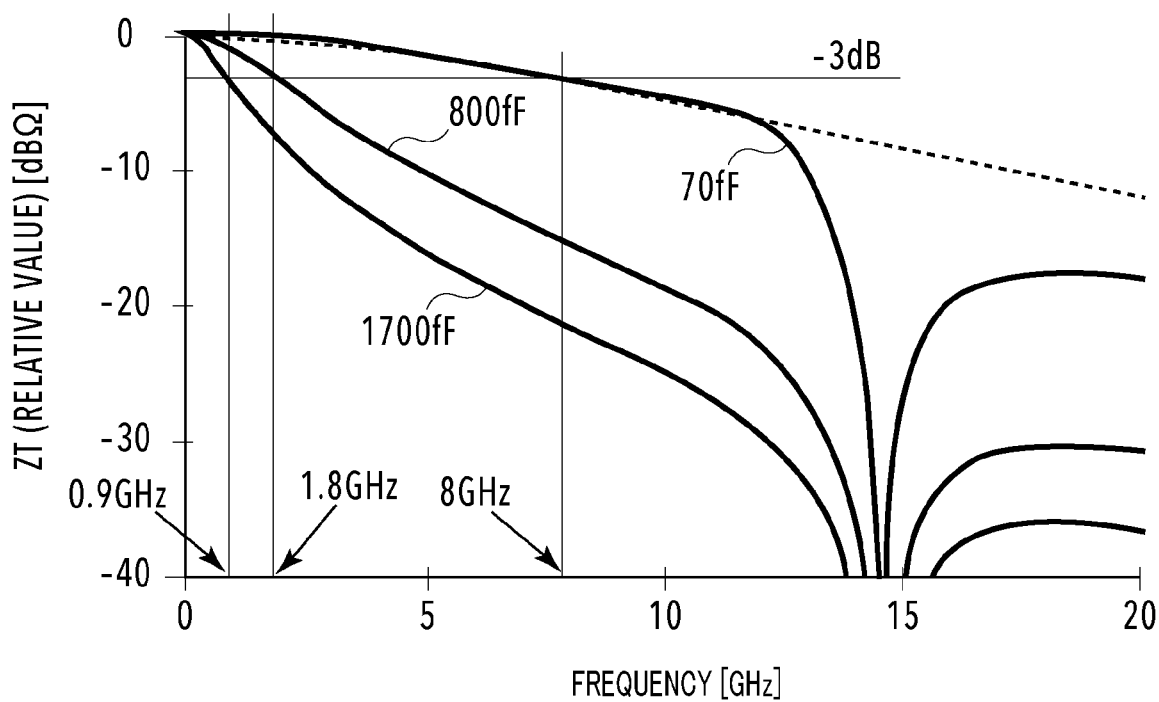
FIG. 9 illustrates the frequency characteristic of the gain when the switch of the TIA according to Illustrative Embodiment 2 is switched.

FIG. 9 illustrates the frequency characteristic of the gain when the switch of the TIA according to Illustrative Embodiment 2 is switched. The solid line shows the conversion gain of the TIA 40 of Illustrative Embodiment 2 shown in FIG. 8. The capacities C21, C22, and C23 of the filter 44 are shown by the characteristic of 70 fF, 800 fF, and 1700 fF. The filter 44 has L1 and C1 of the parallel resonance circuit set to 400 pH and 300 fF as in the TIA 30 of Illustrative Embodiment 1, respectively. The dotted line shows the conversion gain of the conventional TIA 10 of FIG. 1.

The characteristics shown by the solid lines show the frequency characteristics corresponding to the respective capacity values when the control signals Vc1 to Vc3 are used to turn ON SW1 only, to turn ON SW2 only, and to turn ON SW3 only. In this case, the −3 dB band is 8 GHz, 1.8 GHz, and 0.9 GHz, respectively to provide preferred signal speeds such as 10 Gb/s, 2.5 Gb/s, and 1.25 Gb/s, respectively.

As described above, Illustrative Embodiment 2 provides a plurality of capacities and switches that can be turned ON or OFF by a control signal, thus providing a different −3 dB band to cope with a plurality of speeds. Illustrative Embodiment 2 also can allow the gain of an unnecessary frequency band to sharply attenuate. Thus, the similar effect as described above can be provided according to which such a TIA can be realized that has low noise and a high sensitivity, thus suppresses unintended oscillation, and that provides reduced dispersion of frequency characteristics.

The three capacities and the three switches were described. However, the number of capacities and switches may be increased or reduced depending on the type of a required signal speed. One switch has been described as being simultaneously turned ON. However, ON and OFF operations of switches can be freely combined. When assuming that the number of capacities and switches is n, then the nth power of 2 of different signal speeds can be handled. All of a plurality of capacities do not always require switches. Thus, the effect of the invention also can be provided when at least one capacity has a switch and there is a capacity always connected to a signal line.

Illustrative Embodiment 3

Figure 10:
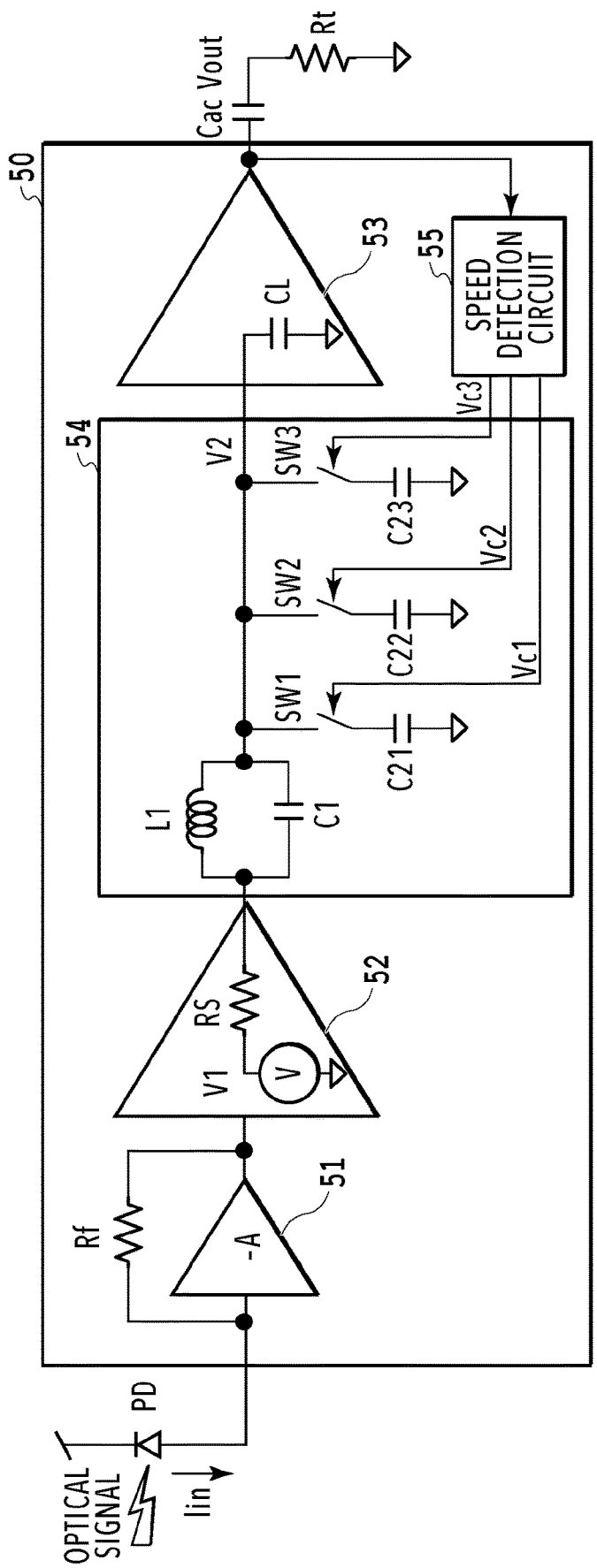
FIG. 10 illustrates a circuit block of the TIA according to Illustrative Embodiment 3 of the present invention.

FIG. 10 illustrates a circuit block of the TIA according to Illustrative Embodiment 3 of the present invention. A TIA 50 includes a transimpedance stage 51, an intermediate buffer 52, a filter 54, and an output buffer 53 connected in this order. In Illustrative Embodiment 3, a speed detection circuit 55 is added to the TIA 40 of Illustrative Embodiment 2 shown in FIG. 8. The output signal of the TIA 50 is branched to the speed detection circuit 55 to detect a signal speed. Depending on the detection result, control signals Vc1, Vc2, and Vc3 are outputted and the switches are turned ON or OFF to cope with a plurality of signal speeds.

The value of the capacities connected by turning ON the switches is set to be reduced when the signal speed is high and is set to be increased when the signal speed is low, thus providing an optimal −3 dB band to a plurality of signal speeds. Illustrative Embodiment 3 provides, in addition to the above-described effect, another effect to automatically set, without requiring an external control signal, an optimal band to the signal speed. This consequently can eliminate the need for a circuit such as an external control LSI and can eliminate the need for the wiring between a control LSI and an amplifier, thus providing a lower-cost mounting operation. The filter 54 can be configured so that the number of the capacities and switches and the combination of ON/OFF of the switches can be expanded as in Illustrative Embodiment 2.

Illustrative Embodiment 4

Figure 11:
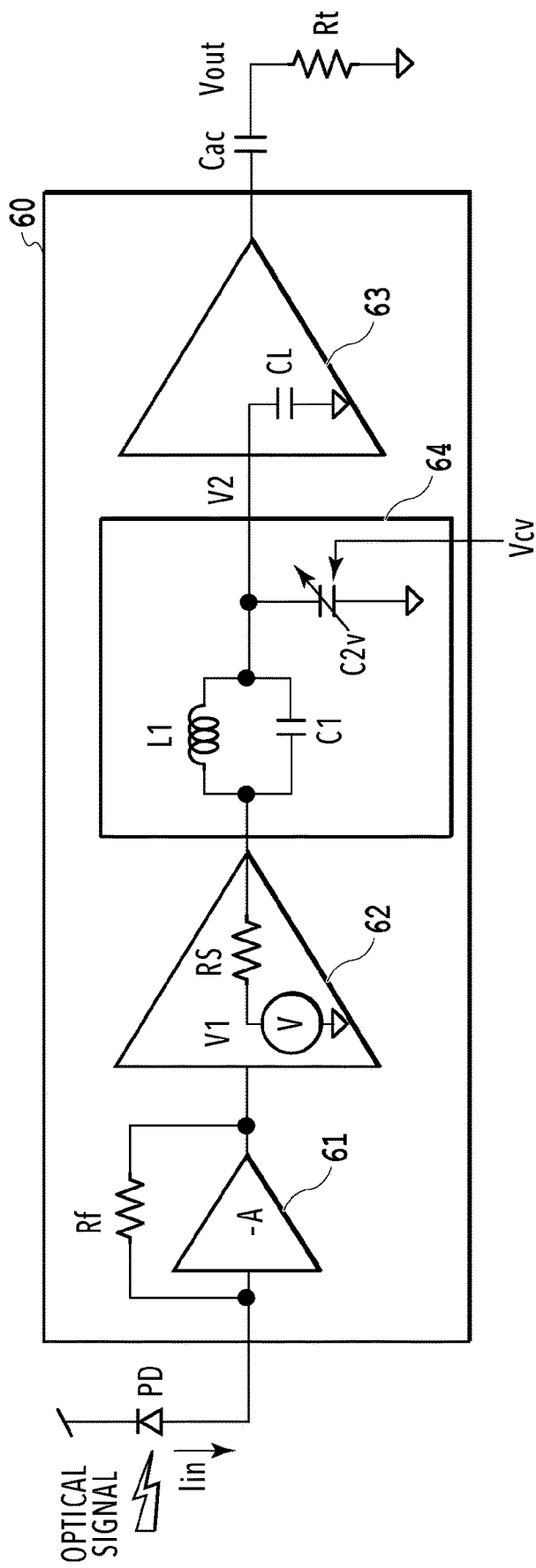
FIG. 11 illustrates a circuit block of the TIA according to Illustrative Embodiment 4 of the present invention.

FIG. 11 is a circuit block illustrating the TIA according to Illustrative Embodiment 4 of the present invention. A TIA 60 includes a transimpedance stage 61, an intermediate buffer 62, a filter 64 and an output buffer 63 connected in this order. In Illustrative Embodiment 4, the capacity C2 of the filter 34 of Illustrative Embodiment 1 shown in FIG. 4 is substituted with a variable capacity $C2v$ and an analog control signal Vcv is used to change the capacity value of the variable capacity $C2v$. The variable capacity $C2v$ is composed of, for example, an MOS varactor or a varactor diode.

According to Illustrative Embodiment 4, the capacity value of the variable capacity $C2v$ can be changed by adjusting the electric potential of the control signal Vcv, thus providing an optimal −3 dB band to various signal speeds. When Illustrative Embodiment 4 is compared with Illustrative Embodiment 2 shown in FIG. 8, Illustrative Embodiment 2 can set the band only within a range of the combination of fixed capacity values (C21, C22, and C23 of the filter 44) and Illustrative Embodiment 4 on the other hand can advantageously provide a continuous setting of the band. For example, even when a new signal speed is added after the manufacture of the TIA 60, a −3 dB band corresponding to the new signal speed can be set by controlling the control signal Vcv in the range within which of the variable capacity $C2v$ can be varied.

Illustrative Embodiment 5

Figure 12:
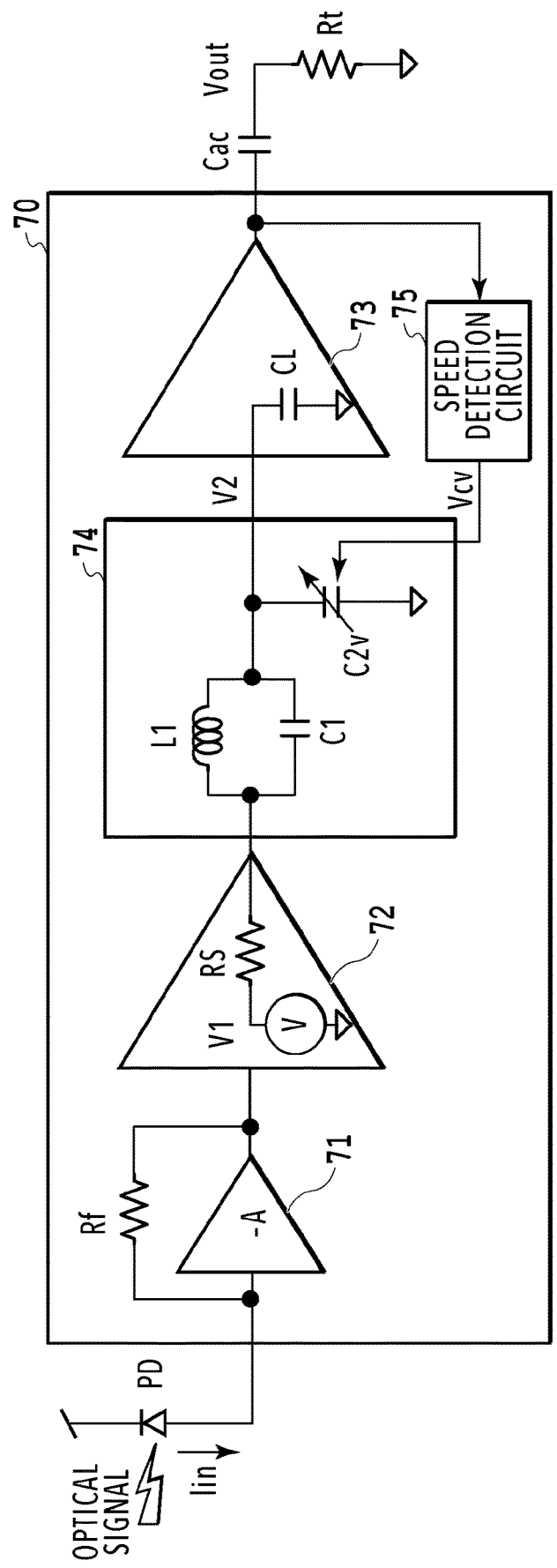
FIG. 12 illustrates a circuit block of the TIA according to Illustrative Embodiment 5 of the present invention.

FIG. 12 illustrates a circuit block of the TIA according to Illustrative Embodiment 5 of the present invention. A TIA 70 includes a transimpedance stage 71, an intermediate buffer 72, a filter 74, and an output buffer 73 connected in this order. In Illustrative Embodiment 5, a speed detection circuit 75 is added to the TIA 60 of Illustrative Embodiment 4 shown in FIG. 11. The output signal of the TIA 70 is branched to the speed detection circuit 75 to detect the signal speed. Based on the detection result, the control signal Vcv is outputted to change the capacity value of the variable capacity $C2v$ to cope with a plurality of signal speeds. A control is provided to reduce the capacity value when the detected signal speed is high and to increase the capacity value when the signal speed is low, thereby providing an optimal −3 dB band to various signal speeds.

As in Illustrative Embodiment 3, Illustrative Embodiment 5 also can eliminate the need for a circuit such as an external control LSI and can eliminate the need for the wiring between a control LSI and an amplifier, thus providing a lower-cost mounting operation.

Illustrative Embodiment 6

Figure 13:
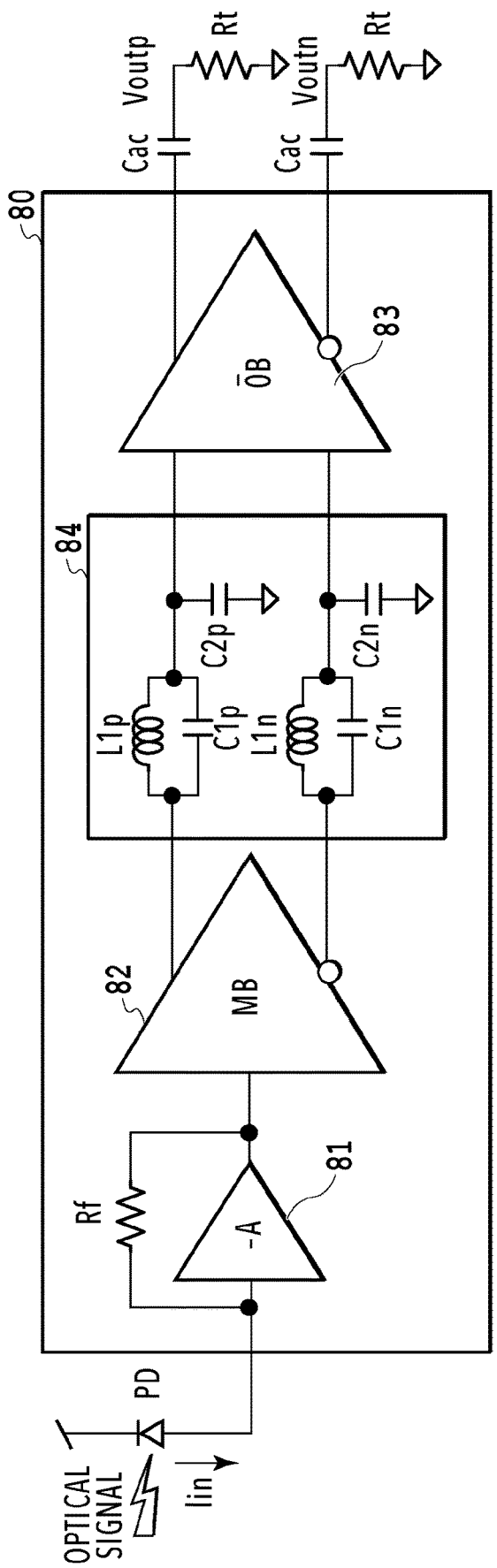
FIG. 13 illustrates a circuit block of the TIA according to Illustrative Embodiment 6 of the present invention.

FIG. 13 illustrates a circuit block of the TIA according to Illustrative Embodiment 6 of the present invention. In Illustrative Embodiments 1-5, a single-phase signal is allowed to pass through a transmission path extending from the intermediate buffer to the output buffer. However, in Illustrative Embodiment 6, a differential signal is allowed to pass therethrough. A TIA 80 includes a transimpedance stage 81, an intermediate buffer 82, a filter 84, and an output buffer 83 connected in this order. The intermediate buffer 82 has a differential output. The filter 84 and the output buffer 83 have differential input and output.

The filter 84 has, in an in-phase signal path, a parallel resonator consisting of the inductor $L1p$ and the capacity $C1p$ and the capacity $C2p$ and has, in a reversed-phase signal path, a parallel resonator consisting of the inductor $L1n$ and the capacity $C1n$ and the capacity $C2n$. The intermediate buffer has an in-phase-side output connected to one end of an LC parallel resonance circuit consisting of the inductor $L1p$ and the capacity $C1p$. The other end of the LC parallel resonance circuit is connected to the in-phase-side input of the output buffer and one end of the capacity $C2p$. The other end of the capacity $C2p$ is connected to a reference electric potential (e.g., a ground electric potential). The intermediate buffer has a reversed-phase-side output connected to one end of the LC parallel resonance circuit consisting of the inductor $L1n$ and the capacity $C1n$. The other end of the LC parallel resonance circuit is connected to the reversed-phase-side input of the output buffer and one end of the capacity $C2n$. The other end of the capacity $C2n$ is connected to a reference electric potential (e.g., a ground electric potential).

Illustrative Embodiment 6 also can allow, by the LC parallel resonance circuit, the gain to sharply attenuate at a frequency exceeding the −3 dB band. This can provide a similar effect as in a single-phase signal as described above to reduce the output noise, to suppress the oscillation, and to reduce the dispersion of frequency characteristics without the need for an increase of the power consumption.

As in Illustrative Embodiments 2 and 3, a configuration including a plurality of capacities and switches or a configuration as in Illustrative Embodiments 4 and 5 including a variable capacity can be used to cope with a plurality of signal speeds.

Illustrative Embodiment 7

Figure 14:
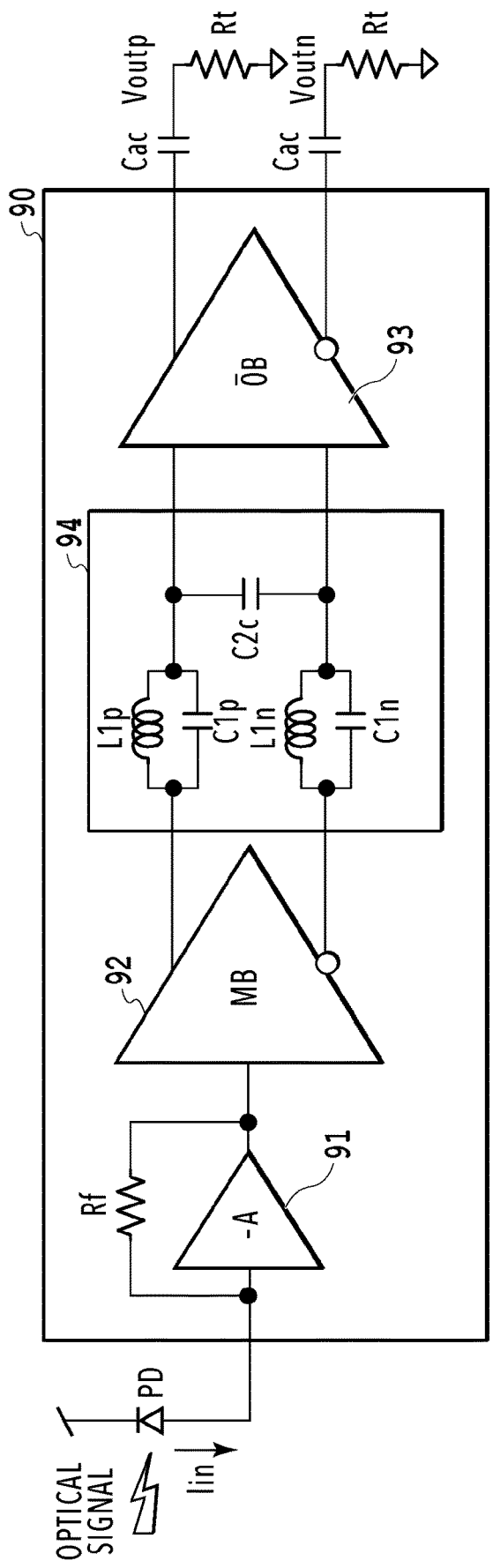
FIG. 14 illustrates a circuit block of the TIA according to Illustrative Embodiment 7 of the present invention.

FIG. 14 illustrates a circuit block of the TIA according to Illustrative Embodiment 7 of the present invention. A TIA 90 includes a transimpedance stage 91, an intermediate buffer 92, a filter 94, and an output buffer 93 connected in this order. Illustrative Embodiment 7 provides the capacity C2c providing the connection between the in-phase and reversed-phase outputs instead of the capacities C2p and C2n inserted between the LC parallel resonance circuit of the respective in-phase and reversed-phase outputs of the filter 84 and the reference electric potential in Illustrative Embodiment 6 shown in FIG. 13, respectively.

By allowing the capacity C2c to have a half capacity value than those of the capacities C2p and C2n, the same frequency characteristic is obtained. Thus, a smaller area is advantageously required by the capacities when compared with Illustrative Embodiment 6. Illustrative Embodiment 7 also can provide the above-described effect. The capacity C2c can be substituted with a plurality of capacities and switches or a variable capacity to cope with a plurality of signal speeds.

Effect of this Embodiment

As has been described above, this embodiment provides a filter having a resonance frequency within a range 1 to 2 times higher than the highest speed of an electric signal passing therethrough, thus allowing the gain of the amplifier to sharply attenuate at a frequency higher than the −3 dB band. This can consequently reduce noise appearing in the output of the amplifier, thus configuring an optical receiver having a higher sensitivity.

The sharp attenuation of the gain can suppress the amplification of the unintended resonance phenomenon due to a parasitic element such as a package on which the amplifier is mounted, thus suppressing the oscillation.

The −3 dB band determined mainly by passive elements can reduce the dispersion of band characteristics. In addition, these effects can be realized without requiring an increase of the power consumption.

Application to Amplifier

The TIA has been described as an example of an amplifier requiring a high sensitivity. However, the invention is not limited to the TIA. This embodiment also can be applied to other amplifiers. For example, a configuration may be used in which the initial stage is not a transimpedance stage but is a voltage amplification stage and the intermediate buffer is an input buffer so long as the output of the intermediate buffer is connected to the input of the filter and the output of the filter is connected to the input of the output buffer and the filter has the above-described frequency characteristic. This consequently can realize an amplifier to provide the sharp attenuation of the gain outside of the signal band, to achieve reduced noise and a high sensitivity, to suppress an unintended oscillation phenomenon, and to suppress the dispersion of band characteristics. In addition, the above-described effect of this embodiment can be obtained without requiring an increased power consumption and without having an influence on the input/output impedance of the amplifier.

The effect of this embodiment also can be obtained when both or one of the intermediate buffer and the output buffer have or has a multi-stage configuration consisting of buffers of a plurality of stages.

The effect can be further enhanced by allowing a single semiconductor chip to have thereon the intermediate buffer, the LC parallel resonance circuit, and the output buffer. If these circuit blocks are provided on different semiconductor chips, it is difficult to provide the impedance matching among the respective chips during a high-speed signal transmission on the order of 1 to 10 Gb/s. It is especially difficult to provide the impedance matching between the LC parallel resonance circuit and circuit blocks sandwiching the LC parallel resonance circuit, which may cause a risk where the signal waveform is deteriorated due to the influence by reflection for example. These circuit blocks formed on a single semiconductor chip require the length of about 100 μm at most for the connection among the blocks, thus easily providing the impedance matching for the signal transmission on the order of 10 Gb/s.

As described above, the LC parallel resonance circuit, which is sandwiched between the intermediate buffer and the output buffer, is isolated from the input/output terminal of the amplifier chip so long as the LC parallel resonance circuit is formed on a single semiconductor chip. This prevents the influence on the reflection characteristic of the input and the output and prevents a deteriorated signal. A similar effect also can be provided by the TIA as in Illustrative Embodiments 1-7 in which the transimpedance stage is provided in the first stage by the integration on a single semiconductor.

The invention claimed is:

1. An amplifier for amplifying an electric signal, comprising:
   a first buffer for amplifying the electric signal;
   a filter connected to an output of the first buffer and including a parallel circuit including an inductor and a first capacity; and
   a second buffer connected to an output of the filter,
   wherein a resonance frequency of the parallel circuit is higher than a −3 dB band of the output of the first buffer and is 1 to 2 times higher than a highest speed of a signal speed of the electric signal.

2. The amplifier according to claim 1, wherein the filter further includes a second capacity having one end connected to an output of the parallel circuit and having the other end connected to a reference electric potential.

3. The amplifier according to claim 2, wherein the second capacity is a variable capacity.

4. The amplifier according to claim 3, further comprising a speed detection circuit connected to an output of the second buffer and for detecting the signal speed of the electric signal to control the variable capacity depending on the detected signal speed.

5. The amplifier according to claim 3, wherein the variable capacity is configured by a MOS varactor or a varactor diode.

6. The amplifier according to claim 1, wherein the filter includes a plurality of second capacities having one ends connected to an output of the parallel circuit and having the other ends connected to a reference electric potential, and at least one switch is inserted between the one end of the second capacities and the output of the parallel circuit.

7. The amplifier according to claim 6, further comprising a speed detection circuit connected to an output of the second buffer and for detecting a signal speed of the electric signal to control the at least one switch depending on the detected signal speed.

8. The amplifier according to claim 6, wherein the switch is configured by a MOS transistor.

9. The amplifier according to claim 1, further comprising a transimpedance stage connected to the input of the first buffer to convert a current signal to a voltage signal.

10. The amplifier according to claim 1, wherein the first buffer, the filter, and the second buffer are provided on a single semiconductor chip.

11. An amplifier for amplifying an electric signal, comprising:
    a first buffer for amplifying the electric signal wherein the output of the first buffer have a configuration to transmit a differential signal and have an in-phase signal path and a reversed-phase signal path;
a filter including a first parallel circuit connected to the output of the in-phase signal path of the first buffer and including a first inductor and a first capacity and a second parallel circuit connected to the output of the reversed-phase signal path of the first buffer and including a second inductor and a second capacity; and
a second buffer including an input of the in-phase signal path connected to an output of the first parallel circuit and an input of the reversed-phase signal path connected to an output of the second parallel circuit,
wherein a resonance frequency of the first parallel circuit and the second parallel circuit is hither than a −3 dB band of the output of the first buffer and is 1 to 2 times higher than a highest speed of a signal speed of the electric signal.

12. The amplifier according to claim 11, wherein the filter further includes a third capacity having one end connected to an output of the first parallel circuit and having the other end connected to a reference electric potential, and a fourth capacity having one end connected to an output of the second parallel circuit and having the other end connected to the reference electric potential.

13. The amplifier according to claim 11, wherein the filter further includes a third capacity connected between an output of the first parallel circuit and an output of the second parallel circuit.

14. The amplifier according to claim 11, further comprising a transimpedance stage connected to the input of the first buffer to convert a current signal to a voltage signal.

15. The amplifier according to claim 11, wherein the first buffer, the filter, and the second buffer are provided on a single semiconductor chip.

16. An amplifier for amplifying an electric signal, comprising:
a first buffer for amplifying the electric signal wherein the output of the first buffer have a configuration to transmit a differential signal and have an in-phase signal path and a reversed-phase signal path;
a filter including a first parallel circuit connected to the output of the in-phase signal path of the first buffer and including a first inductor and a first capacity and a second parallel circuit connected to the output of the reversed-phase signal path of the first buffer and including a second inductor and a second capacity; and
a second buffer including an input of the in-phase signal path connected to an output of the first parallel circuit and an input of the reversed-phase signal path connected to an output of the second parallel circuit,
wherein the filter further includes a third capacity having one end connected to an output of the first parallel circuit and having the other end connected to a reference electric potential, and a fourth capacity having one end connected to an output of the second parallel circuit and having the other end connected to the reference electric potential.

17. The amplifier according to claim 16, wherein the third and the fourth capacity is a variable capacity.

18. The amplifier according to claim 16, wherein the filter includes:
a plurality of third capacities having one ends connected to an output of the first parallel circuit and having the other ends connected to a reference electric potential, and at least one switch is inserted between the one end of the third capacities and the output of the first parallel circuit;
a plurality of fourth capacities having one ends connected to an output of the second parallel circuit and having the other ends connected to a reference electric potential, and at least one switch is inserted between the one end of the fourth capacities and the output of the second parallel circuit.

* * * * *